(12) United States Patent
Lee et al.

(10) Patent No.: US 7,457,181 B2
(45) Date of Patent: Nov. 25, 2008

(54) MEMORY DEVICE AND METHOD OF OPERATING THE SAME

(75) Inventors: Hoon Lee, Seoul (KR); Kee-Won Kwon, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 21 days.

(21) Appl. No.: 11/600,552

(22) Filed: Nov. 16, 2006

(65) Prior Publication Data
US 2007/0109892 A1    May 17, 2007

(30) Foreign Application Priority Data
Nov. 17, 2005    (KR)    ...................... 10-2005-0110158

(51) Int. Cl.
*G11C 7/02* (2006.01)
(52) U.S. Cl. .................. 365/208; 365/185.25; 365/203; 365/230.06
(58) Field of Classification Search ................. 365/208, 365/185.25, 203, 230.06
See application file for complete search history.

(56) References Cited

U.S. PATENT DOCUMENTS

| 6,930,950 B2 | 8/2005 | Kinoshita et al. | |
| 6,985,394 B2 * | 1/2006 | Kim | 365/203 |
| 7,239,566 B2 * | 7/2007 | Kim | 365/203 |

FOREIGN PATENT DOCUMENTS

| JP | 07-235187 | 9/1995 |
| JP | 2004-279160 | 10/2004 |
| KR | 10-0177754 | 11/1998 |
| KR | 10-2002-0057284 | 7/2002 |
| KR | 10-2003-0019081 | 3/2003 |
| KR | 10-2004-0002441 | 1/2004 |
| KR | 10-2004-0049175 | 6/2004 |

\* cited by examiner

*Primary Examiner*—Connie C Yoha
(74) *Attorney, Agent, or Firm*—Mills & Onello LLP

(57) ABSTRACT

A memory device has a global input/output line pair configured for data transfer. The memory device includes a sense amplifier, a detecting unit and a detect control signal generating unit. The sense amplifier is coupled to the global input/output line pair. The detecting unit detects a potential difference between the global input/output line pair. The detect control signal generating unit disables an operation of the sense amplifier and precharges the global input/output line pair to a predetermined voltage. A precharge operation of a memory device may be performed at a higher speed so that a high speed operation of the memory device may be achieved. In addition, the operating time of the sense amplifier may be decreased so that the power consumption of the memory device may be reduced.

25 Claims, 7 Drawing Sheets

MEMORY DEVICE AND METHOD OF OPERATING THE SAME

CROSS-REFERENCE TO RELATED APPLICATIONS

This application claims priority under 35 USC § 119 to Korean Patent Application No. 10-2005-0110158 filed on Nov. 17, 2005, in the Korean Intellectual Property Office, the contents of which are herein incorporated by reference in its entirety.

BACKGROUND OF THE INVENTION

1. Field of the Invention

The present invention relates to a memory device having a global input/output line, and more particularly to a memory device and a method of operating the same for controlling an operation of a sense amplifier coupled to the global input/output line and controlling a precharge operation of the global input/output line.

2. Description of the Related Art

Generally, a memory device has a hierarchical structure of data input/output lines to read data stored in a memory cell or write data to the memory cell. To allow for continuous transfer of data, the input/output lines are typically precharged to a predetermined voltage level repeatedly during a read or write operation.

FIG. 1 is a block diagram illustrating a conventional memory device having a hierarchical structure of input/output lines.

Referring to FIG. 1, the memory device 100 includes a core area 110 and a peripheral area 120. The core area 110 includes memory cells 111, a bit line pair BL and /BL coupled to the memory cells, a bit line sense amplifier 112 for detecting and amplifying a voltage difference between the bit line pair, a local input/output line pair LIO and /LIO coupled to the bit line pair through a first switching circuit 113 and a global input/output line pair GIO and /GIO coupled to the local input/output pair LIO and /LIO through a second switching circuit 114.

The peripheral area 120 includes a control signal generating unit 121, a precharge circuit 122 for precharging the global input/output line pair GIO and /GIO to a predetermined voltage level, a sense amplifier 123 for detecting and amplifying a voltage difference between the global input/output line pair GIO and /GIO and an output buffer 124.

The control signal generating unit 121 generates a first switching control signal CSL, a second switching control signal SEL, a sense amplifier control signal PIOSE and a precharge control signal PIOPPB for the global input/output line pair in response to a read command RD and an address signal ADDR.

The signal CSL controls a turn-on/off of the first switching circuit 113. The signal SEL controls a turn-on/off of the second switching circuit 114. The signal PIOSE controls enabling or disabling of the sense amplifier 123. The signal PIOPPB controls the precharge circuit 122 to precharge the global input/output line pair GIO and /GIO to a predetermined voltage level.

FIG. 2 is a timing diagram illustrating an operation of a read operation of the memory device in FIG. 1.

Referring to FIGS. 1 and 2, the precharge circuit 122 is enabled by the control signal PIOPPB to precharge the global input/output signal pair GIO and /GIO to a predetermined voltage (e.g., an internal power voltage) before the read command RD and the address ADDR are received. When the read command RD and the address ADDR are received, the PIOPPB signal becomes logic 'high' to disable the precharge circuit 122. The signal CSL turns on the first switching circuit 113 in response to the read command RD and the address ADDR so that data on the bit line pair BL and /BL are transferred to the local input/output line pair LIO and /LIO. The signal SEL turns on the second switching circuit 114 so that data on the local input/output line pair LIO and /LIO are transferred to the global input/output line pair GIO and /GIO. When the second switching circuit 114 is turned on, a voltage difference is generated between the global input/output line pair GIO and /GIO.

Ideally, the signal PIOSE is preferred to become a high state to enable the sense amplifier 123 when the sense amplifier 123 can detect the voltage difference (e.g., ΔV in FIG. 2) between the global input/output line pair GIO and /GIO (e.g., at a time point A in FIG. 2). But, in a real embodiment, the signal PIOSE transitions to a high state at a time point B to enable the sense amplifier 123 in consideration of variations in process, voltage, temperature, etc.

In addition, the signal PIOSE transitions to a low state after a sufficient time period Δt to disable the sense amplifier 123 to enable the sense amplifier 123 to completely detect and amplify the potential difference between the global input/output line pair.

The signal PIOPPB transitions to a low state after the sense amplifier 123 is disabled by the signal PIOSE so as to perform a next bursting operation or a corresponding operation in response to the next input command so that the global input/output line pair GIO and /GIO are again precharged to the predetermined voltage level (e.g., an internal power voltage).

Similarly, the signal CSL and the signal SEL respectively transition to a low state to perform a next bursting operation or corresponding operation according to a next command so that the first and second switching circuits are turned off.

However, since the load of the global input/output line pair is increased as the memory has an increased capacity, a time period required for precharging the global input/output line pair is increased. So as to operate the memory having a large capacity at a high speed, the precharging speed of the global input/output pair needs to be increased. In addition, the operating time of the sense amplifier needs to be minimized so as to achieve high-speed operation and low power consumption of the memory device.

SUMMARY OF THE INVENTION

Accordingly, the present invention is provided to substantially obviate one or more problems due to limitations and disadvantages of the related art.

Example embodiments of the present invention provide a high-speed operating memory device in which a precharging speed of global input/output lines is improved.

Example embodiments of the present invention also provide a memory device with high-speed operation and low power consumption in which an operation time of a sense amplifier is reduced.

Example embodiments of the present invention also provide a method of operating a memory device having global input/output lines.

According to one aspect, the present invention is directed to a memory device which has a memory cell, a local input/output line pair and a global input/output line pair configured for data transfer. The memory device includes a sense amplifier, a detecting unit, a precharge circuit and a detect control signal generating unit. The sense amplifier detects and amplifies a potential difference between the global input/output line pair. The detecting unit generates a detect signal based on a detection of the potential difference between the global input/output line pair. The precharge circuit precharges the global input/output line pair to a predetermined voltage level. The detect control signal generating unit generates a detection sense amplifier control signal for disabling the sense amplifier and a detection precharge control signal for enabling the precharge circuit in response to the detect signal.

In one embodiment, the potential difference between the global input/output line pair corresponds to a potential difference between output signals of the sense amplifier.

In one embodiment, the memory device further comprises a control signal generating unit configured to generate a precharge control signal for controlling the precharge circuit and a sense amplify control signal for controlling the sense amplifier in response to a read command. The control signal generating unit is coupled to the detect control signal generating unit. In one embodiment, the detect control signal generating unit comprises: a first SR latch configured to receive the precharge control signal on a set input terminal and the detect signal on a reset input terminal to generate the detection sense amplifier control signal; and a second SR latch configured to receive the sense amplifier control signal on a set input terminal and the detect signal on a reset input terminal to generate the detection precharge control signal. In one embodiment, the detection precharge control signal is inactivated in response to the detect signal that is activated, thereby enabling the precharge circuit. In one embodiment, the sense amplifier generates an output signal pair respectively having complementary logic levels, and the detecting unit detects the complementary logic levels of the output signal pair of the sense amplifier to activate the detect signal. In one embodiment, the sense amplifier generates an output signal pair, and when all of the output signal pair of the sense amplifier are inactivated, the detect signal transitions to an inactive state after a predetermined time delay.

In one embodiment, the memory device further comprises a first switching circuit configured to couple the local input/output line pair and the global input/output pair. The control signal generating unit generates a first switching control signal for controlling the first switching circuit in response to the read command. The detect control signal generating unit generates a first detection switching control signal for controlling the first switching circuit based on the first switching control signal and the detect signal. In one embodiment, the memory device further comprises a second switching circuit configured to couple the local input/output line pair and a bit line pair. The control signal generating unit generates a second switching control signal for controlling the second switching circuit in response to the read command. The detect control signal generating unit generates a second detection switching control signal for controlling the second switching circuit based on the second switching control signal and the detect signal.

According to another aspect, the present invention is directed to a memory device which includes a local input/output line pair, a global input/output line pair, a precharge circuit, a sense amplifier, a control signal generating unit and a detect control signal generating unit. The local input/output line pair are coupled to a memory cell and a bit line pair through a first switching circuit. The global input/output line pair are coupled to the local input/output line pair through a second switching circuit. The precharge circuit precharges the global input/output line pair to a predetermined voltage level. The sense amplifier detects and amplifies a potential difference between the global input/output line pair. The control signal generating unit generates a first switching control signal, a second switching control signal, a precharge circuit control signal and a sense amplifier control signal in response to a read command. The detect control signal generating unit is coupled to the control signal generating unit and generates a detection precharge control signal for controlling an operation of the precharge circuit, and a detection sense amplifier control signal for controlling an operation of the sense amplifier based on the detected potential difference between the global input/output line pair.

In one embodiment, the detect control signal generating unit generates a first detection switching control signal such that the first switching circuit is turned on based on the first switching control signal and such that the first switching circuit is turned off based on the detect signal. In one embodiment, the detect control signal generating unit generates a second detection switching control signal such that the second switching circuit is turned on based on the second switching control signal and such that the second switching circuit is turned off based on the detect signal. In one embodiment, the detect control signal generating unit includes a plurality of SR latches respectively one of which receives a corresponding control signal on a set input terminal and the detect signal on a reset input terminal to generate the detection precharge control signal, the detection sense amplifier control signal and the first and second switching control signals.

In one embodiment, the detect signal is activated when output signals of the sense amplifier respectively has complementary voltage levels. In one embodiment, the sense amplifier is disabled and the precharge circuit is enabled after the detect signal is activated.

According to another aspect, the present invention is directed to a method of operating a memory device having a memory cell, a local input/output line pair and a global input/output line pair configured for data transfer. The method includes generating a plurality of control signals based on a read command; enabling a sense amplifier coupled to the global input/output line pair in response to at least one of the control signals; generating a detect signal based upon detecting a potential difference between the global input/output line pair; an disabling the sense amplifier and precharging the global input/output line pair to a predetermined voltage level in response to the detect signal.

In one embodiment, the potential difference between the global input/output line pair corresponds to a potential difference between output signals of the sense amplifier.

In one embodiment, the method further comprises disconnecting the local input/output line pair from the global input/output line pair in response to the detect signal.

In one embodiment, the method further comprises disconnecting the local input/output line pair from a bit line pair in response to the detect signal.

In one embodiment, the method further comprises inactivating all of the output signals of the sense amplifier in response to the detect signal.

According to the invention, a precharge operation of a memory device may be performed at a higher speed so that a high-speed operation of the memory device may be achieved. In addition, the operating time of the sense amplifier may be decreased so that the power consumption of the memory device may be reduced.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 3:
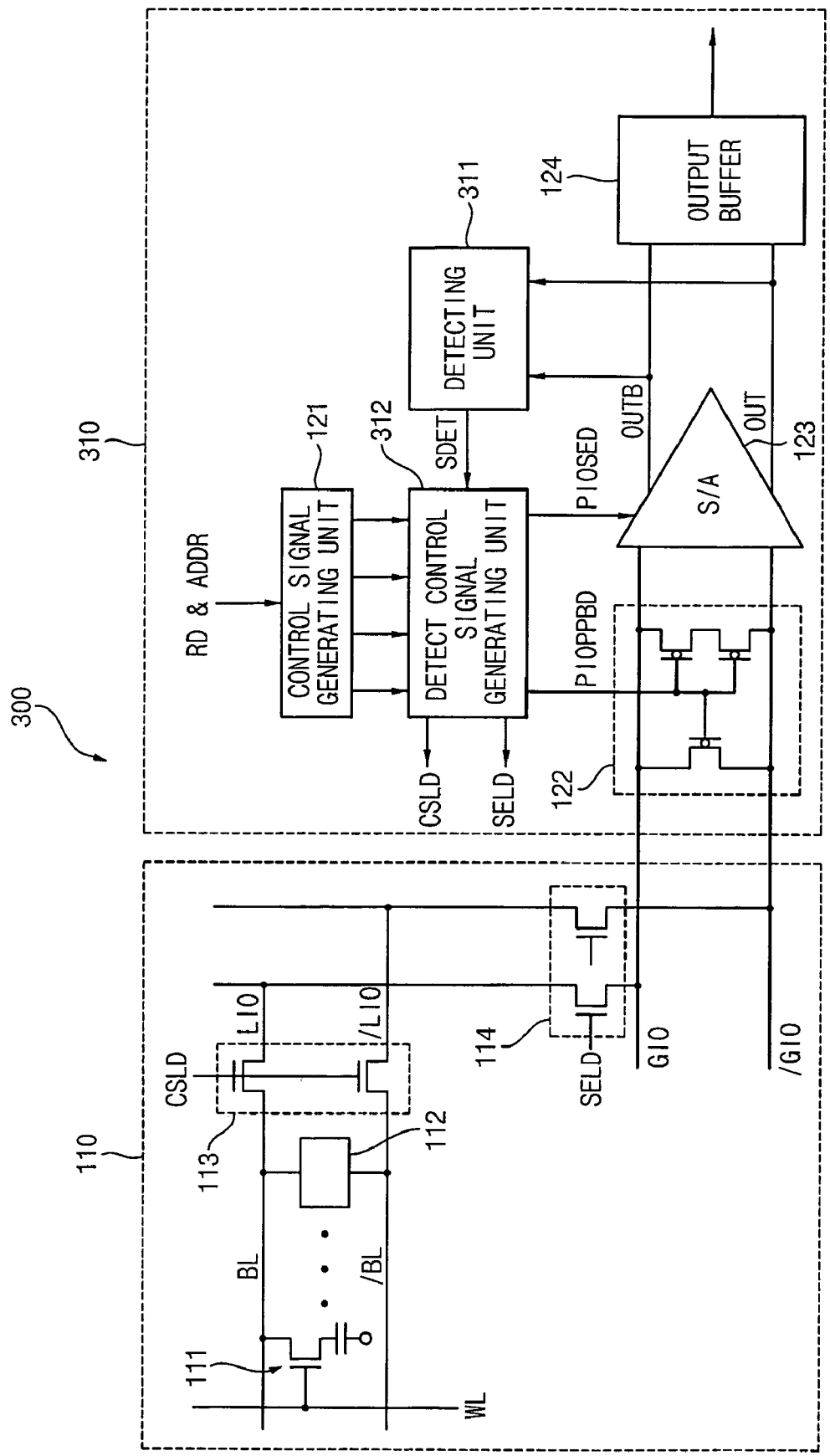
FIG. 3 is a block diagram illustrating a memory device according to an example embodiment of the present invention.

FIG. 3 is a block diagram illustrating a memory device 300 according to an example embodiment of the present invention.

Figure 1:
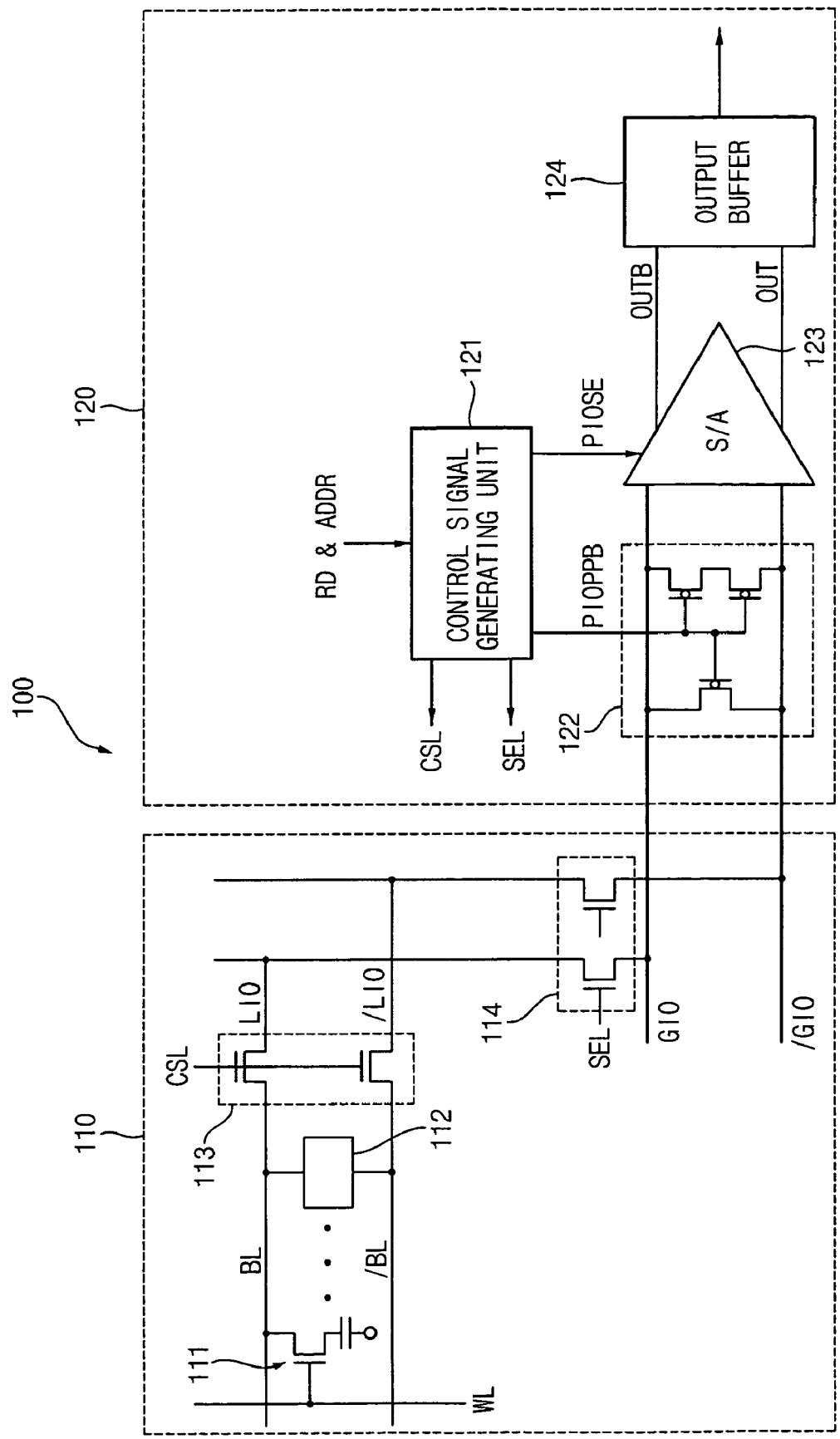
FIG. 1 is a block diagram illustrating a conventional memory device having a hierarchical input/output line.
Figure 2:
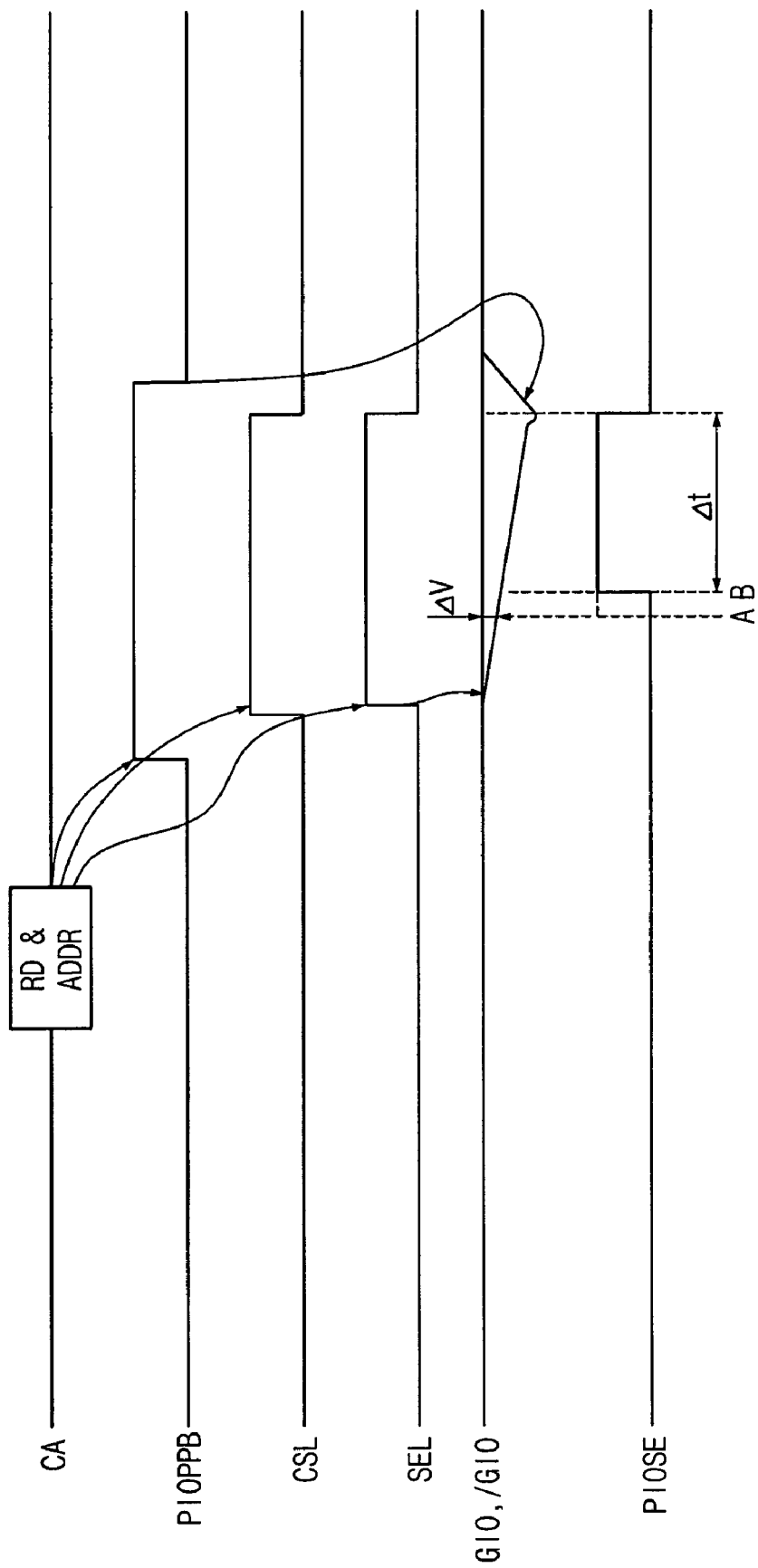
FIG. 2 is a timing diagram illustrating an operation of a read operation of the memory device in FIG. 1.

Referring to FIG. 3, the memory device 300 includes a core area 110 and a peripheral area 310. The core area 110 is substantially the same as the core area of the conventional memory device in FIG. 1 while the peripheral area 310 of FIG. 3 further includes a detecting unit 311 and a detect control signal generating unit 312.

The detecting unit 311 detects a potential difference between global input/output pair GIO and /GIO to activate a detect signal SDET. The potential difference between the global input/output pair GIO and /GIO may indicate a potential difference between an output signal pair OUT and OUTB of a sense amplifier 123 or a potential difference between the global input/output pair GIO and /GIO on input terminals of the sense amplifier 123. That is, the detecting unit 311 may detect an operation of the sense amplifier 123 in response to the output signal pair OUT and OUTB of the sense amplifier 123 to activate the detect signal SDET after an amplifying operation of the sense amplifier 123. Alternatively, the detecting unit 311 may detect the potential difference between the global input/output pair GIO and /GIO on the input terminals of the sense amplifier 123 to activate the detect signal SDET.

The detect control signal generating unit 312 generates detect control signals CSLD, SELD, PIOSED and PIOPPBD based on control signals CSL, SEL, PIOSE and PIOPPB outputted from a control signal generator 121 and the detect signal SDET outputted from the detecting unit 311.

The detect control signal CSLD is a first detection switch control signal for controlling a first switching circuit 113. The detect control signal SELD is a second detection switch control signal for controlling a second switching circuit 114. The detect control signal PIOSED is a detection sense amplifier control signal for controlling an enablement and/or disablement of the sense amplifier 123. The detect control signal PIOPPBD is a detection precharge control signal for precharging the global input/output pair GIO and /GIO to a predetermined voltage level.

Figure 4A:
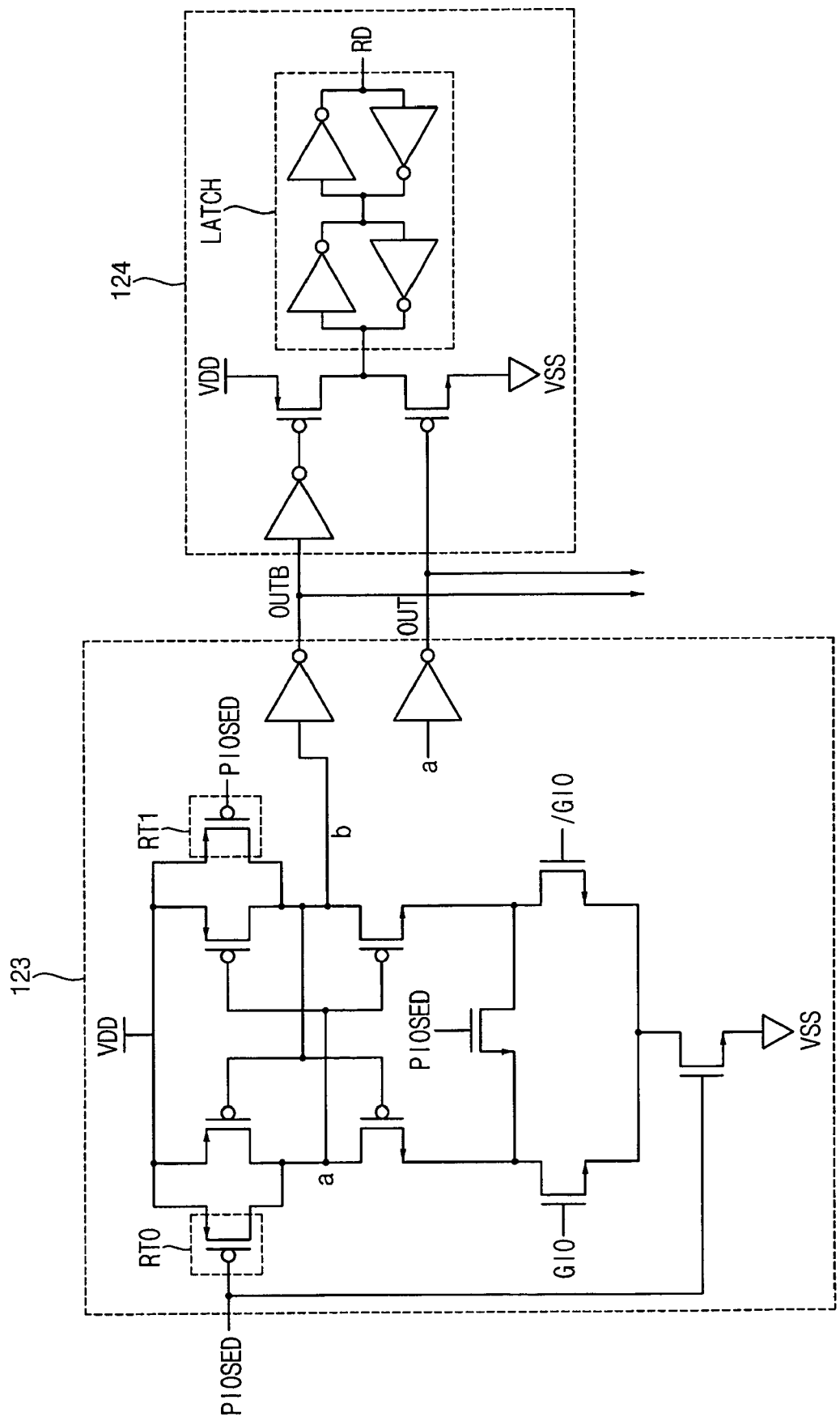
FIG. 4A is a circuit diagram illustrating a sense amplifier and an output buffer of FIG. 3.
Figure 4B:
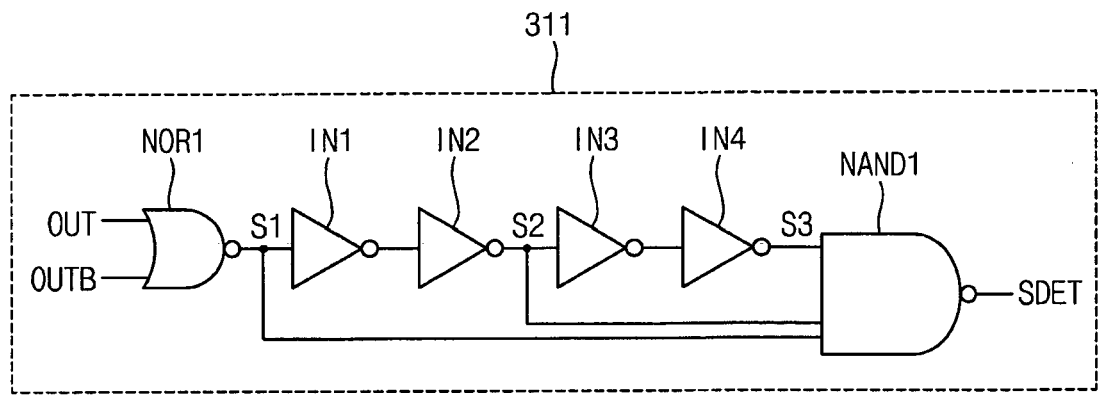
FIG. 4B is a circuit diagram illustrating a detecting unit of FIG. 3.
Figure 4C:
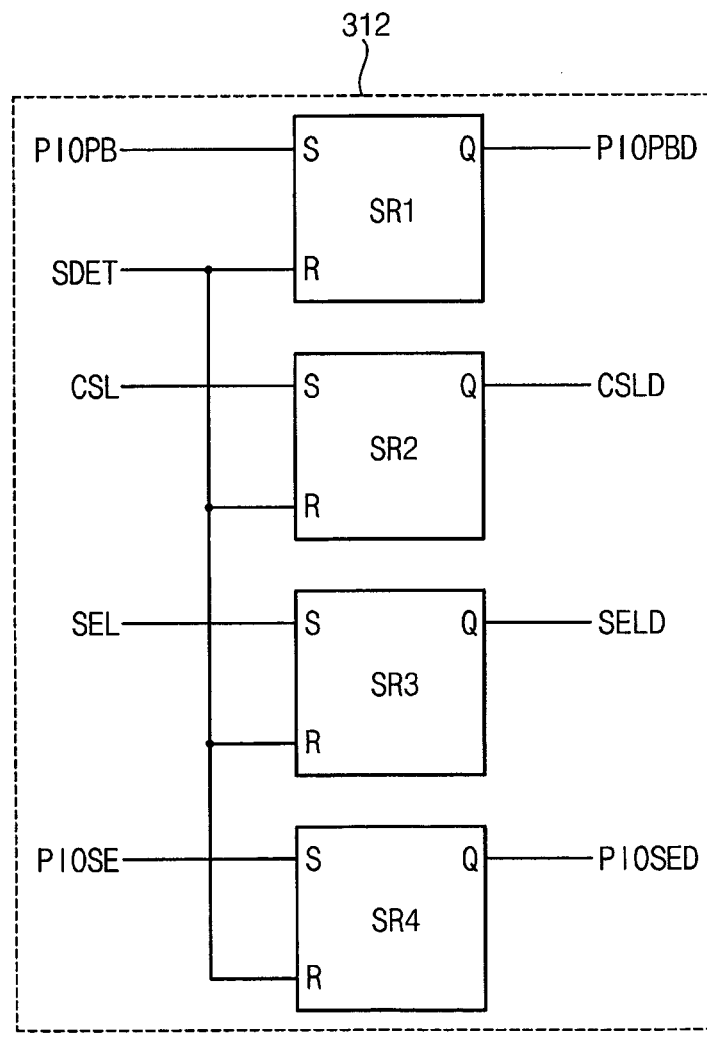
FIG. 4C is a circuit diagram illustrating a detect control signal generating unit of FIG. 3.

FIG. 4A is a circuit diagram illustrating the sense amplifier 123 and an output buffer 124 of FIG. 3, FIG. 4B is a circuit diagram illustrating the detecting unit 311 of FIG. 3, and FIG. 4C is a circuit diagram illustrating the detect control signal generating unit 312 of FIG. 3.

Referring to FIGS. 4A through 4C, the sense amplifier 123 is operated in response to the detect control signal PIOSED. That is, when the signal PIOSED is at logic 'low' the sense amplifier 123 is disabled and when the signal PIOSED is at logic 'high,' the sense amplifier 123 is enabled.

When the sense amplifier 123 is enabled, the sense amplifier 123 detects and amplifies a voltage difference between the global input/output pair GIO and /GIO to generate output signals OUT and OUTB respectively having complementary voltage values.

In addition, when the sense amplifier 123 is disabled by the signal PIOSED at logic 'low', reset transistors RT0 and RT1 are turned on so that the output signals OUT and OUTB become logic 'low'.

The output buffer 124 latches read data RD based on the output signals OUT and OUTB and outputs the latched read data RD to an external device.

The detecting unit 311 includes a NOR gate NOR1, inverters IN1 through IN4 and a NAND gate NAND1 to generate the detect signal SDET based on the output signal pair OUT and OUTB. The detecting unit 311 maintains the detect signal SDET to logic 'low' state when both of the output signals OUT and OUTB are logic 'low', and in a case where at least one of the output signals OUT and OUTB is logic 'high', the SDET signal is activated to logic 'high'. That is, when the sensing operation of the sense amplifier 123 is completed, the detecting unit 311 detects the complementary voltage signals OUT and OUTB to activate the detect signal SDET.

The detect control signal generating unit 312 includes a plurality of SR latches SR0, SR1, SR2 and SR3. The SR latches SR0, SR1, SR2 and SR3 respectively receive corresponding control signals PIOPPB, CLS, SEL and PIOSE on a set input terminal (S) thereof and the detect signal SDET on a reset input terminal (R) to output the detect control signals PIOPPBD, CLSD, SELD and PIOSED. The SR latches SR0, SR1, SR2 and SR3 respectively outputs a logic high signal through a Q terminal when a set input signal is logic 'high' and outputs a logic low signal when a reset input signal is logic 'high', Namely, when the control signals PIOPPB, CLS, SEL and PIOSE on the set input terminal become logic 'high', the SR latches SR0, SR1, SR2 and SR3 respectively delays the control signals PIOPPB, CLS, SEL and PIOSE to force the detect control signals PIOPPBD, CLSD, SELD and PIOSED at logic 'high', and when the SDET signal on the reset input terminal becomes logic 'high', all of the detect control signals PIOPPB, CLS, SEL and PIOSE are forced to logic 'low'.

Figure 5:
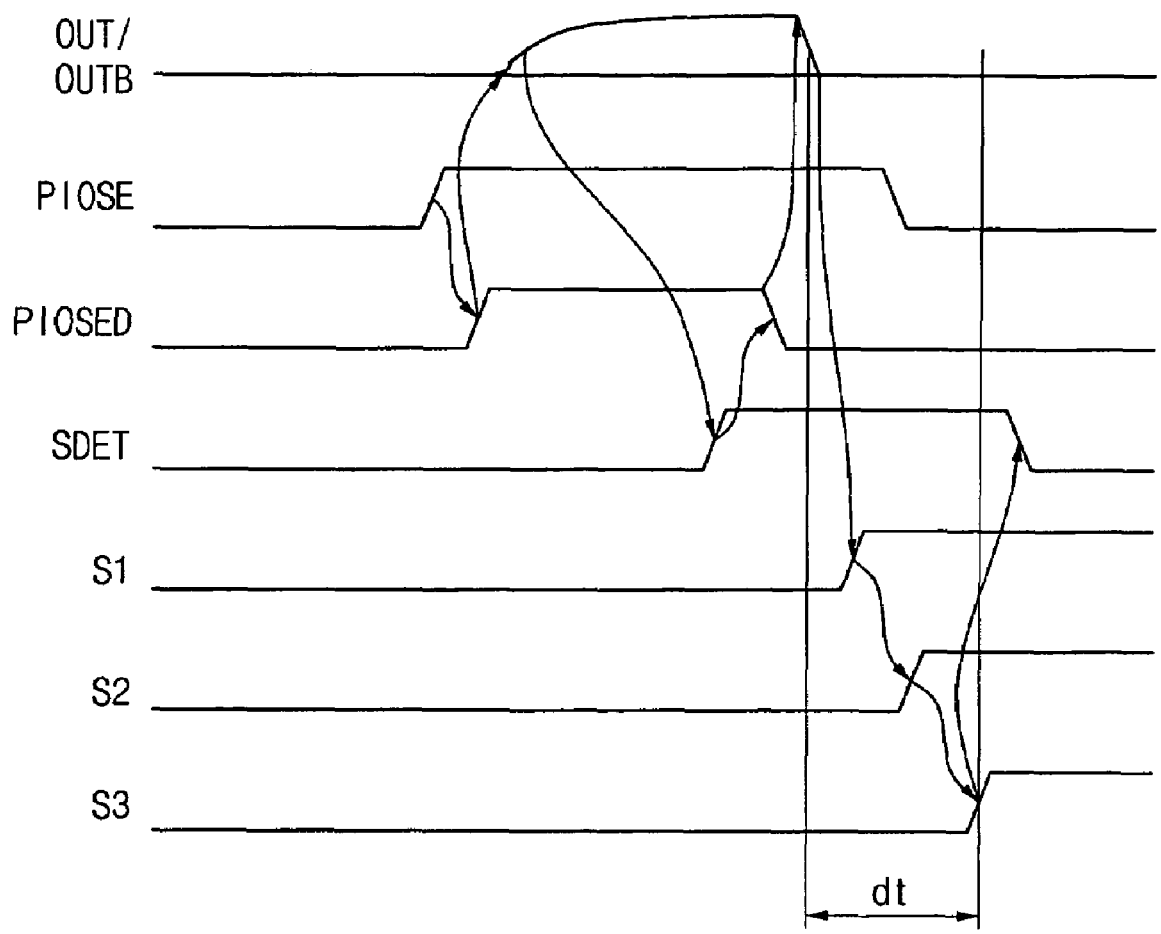
FIG. 5 is a timing diagram illustrating signals of the detecting unit of FIG. 4B and the detect control signal generating unit of FIG. 4C.

FIG. 5 is a timing diagram illustrating signals of the detecting unit of FIG. 4B and the detect control signal generating unit of FIG. 4C.

Referring to FIGS. 4A and 5, the output signals OUT and OUTB are logic 'low' before the sense amplifier 123 is enabled because the reset transistors RT0 and RT1 of the sense amplifier 123 are turned on based on the detect control signal PIOSED having a logic 'low' state.

The signal PIOSE is enabled to a logic 'high' state in the control signal generating unit 121 in response to the read command RD and the address ADDR and provided to the set input terminal of the SR latch SR4 of the detect control signal generating unit 312. Accordingly, the PIOSED signal outputted from the Q terminal of the SR latch SR4 has a logic 'high' state so that the sense amplifier 123 is enabled. The sense amplifier 123 detects and amplifies a potential difference between the global input/output line pair GIO and /GIO to generate the output signals OUT and OUTB having complementary logic levels, i.e., respectively logic 'high' and logic 'low'.

The signal SDET is activated to logic 'high' in response to the complementary output signal pair OUT and OUTB in the detecting unit 311. The signal SDET at logic 'high' is provided to the reset input terminal of the SR latch SR4 to output the signal PIOSED at logic 'low'. Based on the signal PIOSED, the sense amplifier 123 is disabled. Namely, by detecting the output signals OUT and OUTB of the sense amplifier 123, the sense amplifier 123 is disabled immediately after the sense amplifier 123 completes its operation, and thus current consumption of the sense amplifier 123 may be decreased.

By the signal PIOSED having a logic 'low' state, the reset transistors RT0 and RT1 of the sense amplifier 123 are turned on so that both of the output signals OUT and OUTB become logic 'low'. Based on the output signals OUT and OUTB having logic 'low' state, the detect signal SDET becomes logic 'low' again in the detecting unit 311. In order to protect unstable state of the signal PIOSED, that is, in order for the signal PIOSED not to transition to logic 'high' state by the SR latch SR4 in response to the SDET signal having a logic 'low' level, the inverters IN1 through IN4 of the detecting unit 311 are used to ensure a delay time dt in FIG. 5. The delay time dt may vary according to the number of the inverters in the detecting unit 311.

Although the timing diagram is illustrated in FIG. 5 only for the signal PIOSED among the detect control signals PIOPPBD, CLSD, SELD and PIOSED, the other detect control signals PIOPPBD, CLSD and SELD have also substantially the same operation and timing with those illustrated in FIG. 5. Particularly, when the signal SDET is activated to logic 'high', the signal PIOPPBD becomes logic 'low' by the SR latch SR1 to enable the precharge circuit 122 so that the global input/output lines GIO and /GIO are precharged to a predetermined voltage level. That is, by detecting the output signals OUT and OUTB of the sense amplifier 123, the global lines GIO and /GIO are precharged immediately after the sense amplifier 123 completes its operation, and thus the global lines GIO and /GIO may be precharged at a higher speed.

Figure 6:
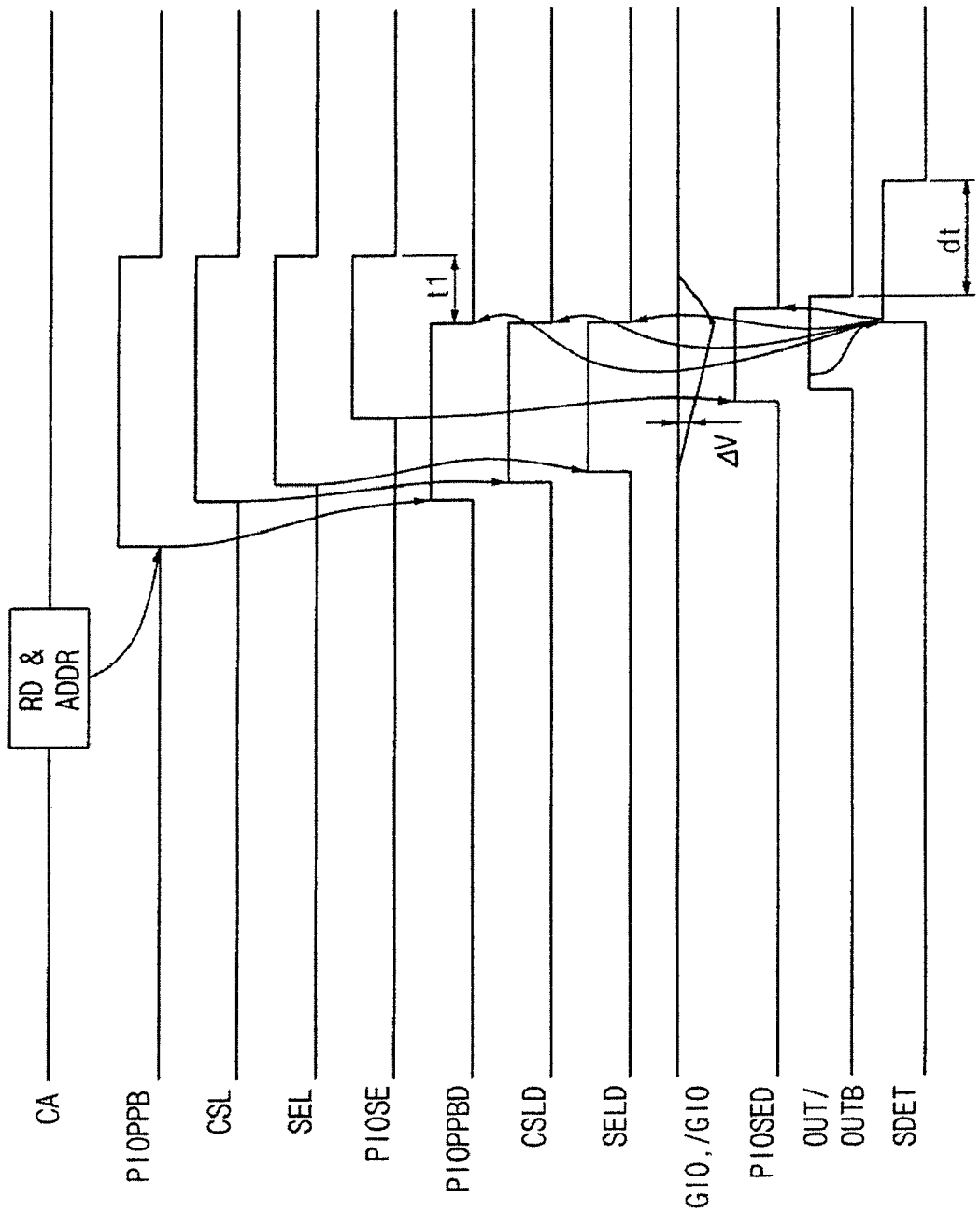
FIG. 6 is a timing diagram illustrating a read operation of a memory device according to an example embodiment of the present invention.

FIG. 6 is a timing diagram illustrating a read operation of a memory device according to an example embodiment of the present invention.

Referring to FIGS. 3 through 6, the read operation of the memory device will be described. Since the generation of the control signals PIOPPB, CSL, SEL and PIOSE by the control signal generating unit 121 in response to the read command RD and the address ADDR is analogous to the conventional art, any further description thereof will be omitted.

The detect control signal generating unit 312 generates the detect control signals PIOPPBD, CSLD, SELD and PIOSED based on the control signals PIOPPB, CSL, SEL and PIOSE that are respectively received on the set input terminal of the SR latches SR1 through SR4 from the control signal generating unit 121.

When the signal PIOPPBD has a logic 'high' state, the precharge circuit 122 is disabled, and the first switching circuit 113 is turned on by the signal CSLD having a logic 'high' state, and thus voltage between the bit line pair BL and /BL is transferred to the local input/output line pair LIO and /LIO. When the signal SELD has a logic 'high' state, the voltage on the local input/output line pair LIO and /LIO is transferred to the global input/output line pair GIO and /GIO so that a voltage difference may be generated on the global input/output lines GIO and /GIO. After the voltage difference between the global input/output lines GIO and /GIO has a magnitude of ΔV, which can be sensed by the sense amplifier 123, the signal PIOSED becomes to logic 'high' to enable the sense amplifier 123.

By the sensing and amplifying operation of the sense amplifier 123, the complementary output signals OUT and OUTB, i.e. respectively having a logic 'high' state and a logic 'low' state, are outputted. The detecting unit 311 detects the complementary voltages output from the sense amplifier 123 to output the signal SDET having a logic 'high' state.

The SDET signal having a logic 'high' state is inputted to the reset input terminal of the SR latches SR1 through SR4 of the detect control signal generating unit 312 to force all of the detect control signals PIOPPBD, CSLD, SELD and PIOSED at logic 'low' state.

Particularly, the signal PIOPPBD becomes logic 'low' to precharge the global input/output line pair GIO and /GIO to a predetermined voltage, and the signal PIOSED becomes logic 'low' to disable the sense amplifier 123. The signal SELD having a logic 'low' turns off the second switching circuit 114 to disconnect the local input/output line pair LIO and /LIO from the global input/output line pair GIO and /GIO. The signal CSLD having a logic 'low' turns off the first switching circuit 113 to disconnect the bit line pair BL and /BL from the local input/output line pair LIO and /LIO. Namely, immediately after the operation of the sense amplifier is completed, the sense amplifier is disabled, the global input/output line pair is precharged and the first and second switching circuits are turned off, and thus the read operation of the next burst data may be performed at a higher speed.

As shown in FIG. 6, the PIOPPBD has a falling edge that precedes the falling edge of the PIOPPB signal by t1. Therefore, the precharge operation according to an example embodiment of the present invention has an increased margin of t1 compared with the conventional art where the precharge circuit is controlled by using the PIOPPB signal.

The reset transistors RT0 and RT1 of the sense amplifier 123 are turned on in response to the falling edge of the signal PIOSED, and thus both of the output signals OUT and OUTB of the sense amplifier 123 become logic 'low'. Based on the output signals OUT and OUTB having logic 'low' levels, the signal SDET becomes logic 'low' state by the detecting unit 311 after the delay time dt of the inverters IN1 through IN4. Namely, the SDET signal again transitions to logic 'low' to control a read operation of the next burst data.

Although it is illustrated that one pair of global input/output lines is coupled to one pair of local input/output lines in the above example embodiments, it is noted that one pair of global input/output lines may be coupled to two or more local input/output line pairs.

As described above, according to the example embodiments of the present invention, a precharge operation of a memory device may be performed at a higher speed so that a high-speed operation of the memory device may be achieved. In addition, the operating time of the sense amplifier may be decreased so that the power consumption of the memory device may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory device having a memory cell, a local input/output line pair and a global input/output line pair configured for data transfer, the memory device comprising:

a sense amplifier configured to detect and amplify a potential difference between the global input/output line pair;
a detecting unit configured to generate a detect signal based on a detection of the potential difference between the global input/output line pair;
a precharge circuit configured to precharge the global input/output line pair to a predetermined voltage level; and
a detect control signal generating unit configured to generate a detection sense amplifier control signal for disabling the sense amplifier and a detection precharge control signal, separate and distinct from the detection sense amplifier control signal, for enabling the precharge circuit in response to the detect signal.

2. The memory device of claim 1, wherein the potential difference between the global input/output line pair corresponds to a potential difference between output signals of the sense amplifier.

3. The memory device of claim 1, further comprising a control signal generating unit configured to generate a precharge control signal for controlling the precharge circuit and a sense amplify control signal for controlling the sense amplifier in response to a read command,
wherein the control signal generating unit is coupled to the detect control signal generating unit.

4. The memory device of claim 3, wherein the detect control signal generating unit comprises:
a first SR latch configured to receive the precharge control signal on a set input terminal and the detect signal on a reset input terminal to generate the detection precharge control signal; and
a second SR latch configured to receive the sense amplifier control signal on a set input terminal and the detect signal on a reset input terminal to generate the detection sense amplifier control signal.

5. The memory device of claim 4, wherein the detection precharge control signal is inactivated in response to the detect signal that is activated, thereby enabling the precharge circuit.

6. The memory device of claim 4, wherein the sense amplifier generates an output signal pair respectively having complementary logic levels, and the detecting unit detects the complementary logic levels of the output signal pair of the sense amplifier to activate the detect signal.

7. The memory device of claim 4, wherein the sense amplifier generates an output signal pair, and when all of the output signal pair of the sense amplifier are inactivated, the detect signal transitions to an inactive state after a predetermined time delay.

8. The memory device of claim 3, further comprising:
a first switching circuit configured to couple the local input/output line pair and the global input/output pair,
wherein the control signal generating unit generates a first switching control signal in response to the read command, and
wherein the detect control signal generating unit generates a first detection switching control signal for controlling the first switching circuit based on the first switching control signal and the detect signal.

9. The memory device of claim 8, further comprising,
a second switching circuit configured to couple the local input/output line pair and a bit line pair,
wherein the control signal generating unit generates a second switching control signal for controlling the second switching circuit in response to the read command, and
wherein the detect control signal generating unit generates a second detection switching control signal for controlling the second switching circuit based on the second switching control signal and the detect signal.

10. A memory device comprising:
a local input/output line pair configured to be coupled to a memory cell and a bit line pair through a first switching circuit;
a global input/output line pair configured to be coupled to the local input/output line pair through a second switching circuit;
a precharge circuit configured to precharge the global input/output line pair to a predetermined voltage level;
a sense amplifier configured to detect and amplify a potential difference between the global input/output line pair;
a control signal generating unit configured to generate a first switching control signal, a second switching control signal, a precharge circuit control signal and a sense amplifier control signal in response to a read command; and
a detect control signal generating unit coupled to the control signal generating unit, configured to generate a detection precharge control signal for controlling an operation of the precharge circuit and a detection sense amplifier control signal, separate and distinct from the detection precharge control signal, for controlling an operation of the sense amplifier based on the detected potential difference between the global input/output line pair.

11. The memory device of claim 10, wherein the detect control signal generating unit generates a first detection switching control signal such that the first switching circuit is turned on based on the first switching control signal and such that the first switching circuit is turned off based on the detect signal.

12. The memory device of claim 11, wherein the detect control signal generating unit generates a second detection switching control signal such that the second switching circuit is turned on based on the second switching control signal and such that the second switching circuit is turned off based on the detect signal.

13. The memory device of claim 12, wherein the detect control signal generating unit includes a plurality of SR latches respectively one of which receives a corresponding control signal on a set input terminal and the detect signal on a reset input terminal to generate the detection precharge control signal, the detection sense amplifier control signal and the first and second switching control signals.

14. The memory device of claim 10, wherein the detect signal is activated when output signals of the sense amplifier respectively has complementary voltage levels.

15. The memory device of claim 14, wherein the sense amplifier is disabled and the precharge circuit is enabled after the detect signal is activated.

16. A method of operating a memory device having a memory cell, a local input/output line pair and a global input/output line pair configured for data transfer, the method comprising:
generating a plurality of control signals based on a read command;
enabling a sense amplifier coupled to the global input/output line pair in response to at least one of the control signals;
generating a detect signal based upon detecting a potential difference between the global input/output line pair; and
generating a detection sense amplifier control signal and disabling the sense amplifier in response to the detect signal, and generating a detection precharge control signal, which is separate and distinct from the detection sense amplifier control signal, and precharging the global input/output line pair to a predetermined voltage level in response to the detect signal.

17. The method of claim 16, wherein the potential difference between the global input/output line pair corresponds to a potential difference between output signals of the sense amplifier.

18. The method of claim 16, further comprising,
disconnecting the local input/output line pair from the global input/output line pair in response to the detect signal.

19. The method of claim 18, further comprising,
disconnecting the local input/output line pair from a bit line pair in response to the detect signal.

20. The method of claim 17, further comprising,
inactivating all of the output signals of the sense amplifier in response to the detect signal.

21. A memory device having a memory cell, a local input/output line pair and a global input/output line pair configured for data transfer, the memory device comprising:
   a sense amplifier configured to detect and amplify a potential difference between the global input/output line pair;
   a detecting unit configured to generate a detect signal based on a detection of the potential difference between the global input/output line pair;
   a precharge circuit configured to precharge the global input/output line pair to a predetermined voltage level;
   a detect control signal generating unit configured to generate a detection sense amplifier control signal for disabling the sense amplifier and a detection precharge control signal for enabling the precharge circuit in response to the detect signal; and
   a control signal generating unit configured to generate a precharge control signal for controlling the precharge circuit and a sense amplify control signal for controlling the sense amplifier in response to a read command,
   wherein the control signal generating unit is coupled to the detect control signal generating unit, and
   wherein the detect control signal generating unit comprises:
      a first SR latch configured to receive the precharge control signal on a set input terminal and the detect signal on a reset input terminal to generate the detection precharge control signal; and
      a second SR latch configured to receive the sense amplifier control signal on a set input terminal and the detect signal on a reset input terminal to generate the detection sense amplifier control signal.

22. The memory device of claim 21, wherein the detection precharge control signal is inactivated in response to the detect signal that is activated, thereby enabling the precharge circuit.

23. The memory device of claim 21, wherein the sense amplifier generates an output signal pair respectively having complementary logic levels, and the detecting unit detects the complementary logic levels of the output signal pair of the sense amplifier to activate the detect signal.

24. The memory device of claim 21, wherein the sense amplifier generates an output signal pair, and when all of the output signal pair of the sense amplifier are inactivated, the detect signal transitions to an inactive state after a predetermined time delay.

25. A memory device comprising:
   a local input/output line pair configured to be coupled to a memory cell and a bit line pair through a first switching circuit;
   a global input/output line pair configured to be coupled to the local input/output line pair through a second switching circuit;
   a precharge circuit configured to precharge the global input/output line pair to a predetermined voltage level;
   a sense amplifier configured to detect and amplify a potential difference between the global input/output line pair;
   a control signal generating unit configured to generate a first switching control signal, a second switching control signal, a precharge circuit control signal and a sense amplifier control signal in response to a read command; and
   a detect control signal generating unit coupled to the control signal generating unit, configured to generate a detection precharge control signal for controlling an operation of the precharge circuit and a detection sense amplifier control signal for controlling an operation of the sense amplifier based on the detected potential difference between the global input/output line pair,
   wherein the detect control signal generating unit generates a first detection switching control signal such that the first switching circuit is turned on based on the first switching control signal and such that the first switching circuit is turned off based on the detect signal,
   wherein the detect control signal generating unit generates a second detection switching control signal such that the second switching circuit is turned on based on the second switching control signal and such that the second switching circuit is turned off based on the detect signal, and
   wherein the detect control signal generating unit includes a plurality of SR latches respectively one of which receives a corresponding control signal on a set input terminal and the detect signal on a reset input terminal to generate the detection precharge control signal, the detection sense amplifier control signal and the first and second switching control signals.

* * * * *